United States Patent [19]

Kawaguchi

[11] Patent Number: 5,003,196

[45] Date of Patent: Mar. 26, 1991

[54] WAVE SHAPING CIRCUIT HAVING A MAXIMUM VOLTAGE DETECTOR AND A MINIMUM VOLTAGE DETECTOR

[75] Inventor: Shintaro Kawaguchi, Kawasaki, Japan

[73] Assignee: Kabushiki Kaisha Toshiba, Kawasaki, Japan

[21] Appl. No.: 338,795

[22] Filed: Apr. 17, 1989

[30] Foreign Application Priority Data

Apr. 18, 1988 [JP] Japan .................................. 63-95009

[51] Int. Cl.⁵ ............................................. H03K 3/29
[52] U.S. Cl. .................................. 307/290; 307/351; 307/356; 307/358; 328/147; 328/151
[58] Field of Search .............. 307/290, 351, 352, 356, 307/358; 328/146, 147, 149, 151

[56] References Cited

U.S. PATENT DOCUMENTS

| | | | |
|---|---|---|---|
| 3,512,010 | 5/1970 | Washburn | 307/290 |
| 4,245,192 | 1/1981 | Whiffen | 307/358 |
| 4,399,414 | 8/1983 | Bird | 307/351 |
| 4,613,770 | 9/1986 | Raab | 307/358 |
| 4,631,737 | 12/1986 | Davis et al. | 307/351 |
| 4,859,872 | 8/1989 | Hyakutake | 328/147 |
| 4,891,535 | 1/1990 | Etheridge | 307/356 |
| 4,912,420 | 3/1990 | Parnell | 307/265 |
| 4,926,442 | 5/1990 | Bukowski et al. | 307/351 |
| 4,959,558 | 9/1990 | Kay et al. | 307/358 |

FOREIGN PATENT DOCUMENTS

| | | | |
|---|---|---|---|
| 0130013 | 6/1987 | Japan | 307/590 |
| 0003636 | 6/1986 | World Int. Prop. O. | 307/358 |

OTHER PUBLICATIONS

IBM Technical Disc. Bulletin, J. D. Harr, Nov. 1974, vol. 17, No. 6, p. 1774.

IBM Technical Disc. Bulletin, S. E. Bigbie and A. A. Nawy, Dec. 1977, vol. 20, No. 7, p. 253.

Primary Examiner—Stanley D. Miller
Assistant Examiner—T. Cunningham
Attorney, Agent, or Firm—Finnegan, Henderson, Farabow, Garrett, and Dunner

[57] ABSTRACT

A Schmitt trigger circuit of the present invention comprises maximum voltage detecting means for detecting and retaining a maximum voltage of an input signal, minimum voltage detecting means for detecting and retaining a minimum voltage of the input signal, and threshold voltage generating means for receiving the detected maximum and minimum voltages and generating threshold voltages.

13 Claims, 10 Drawing Sheets

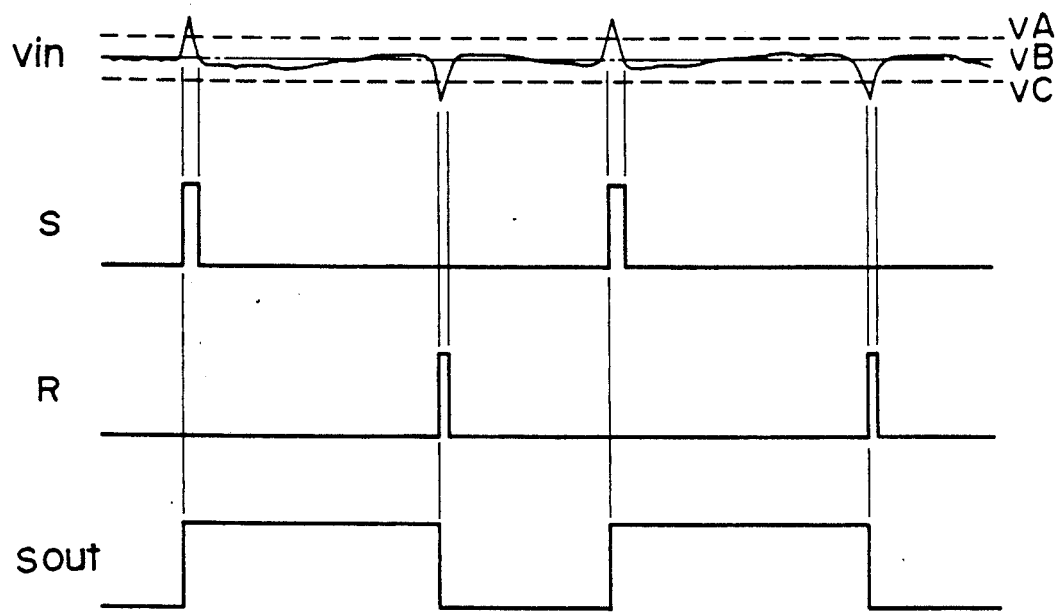
F I G. 3
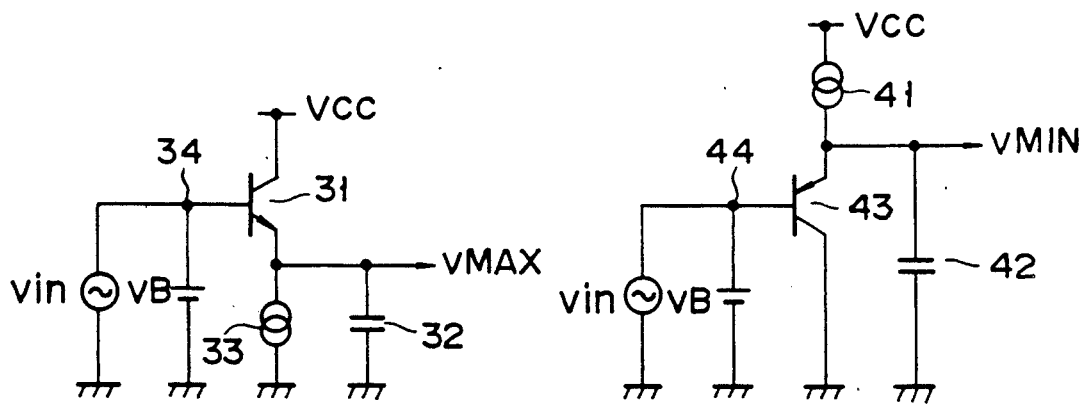
F I G. 4   F I G. 5

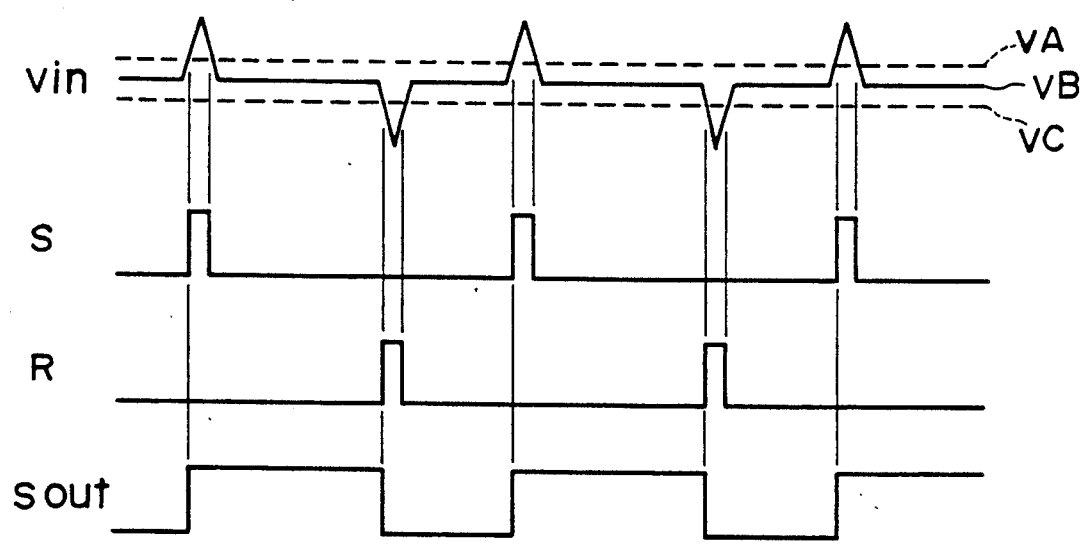
F I G. 8

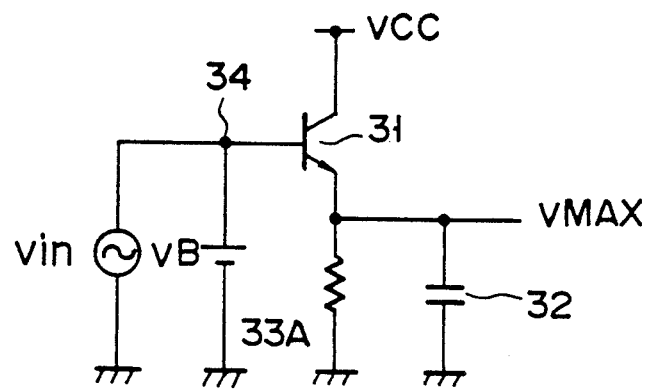
F I G. 11A
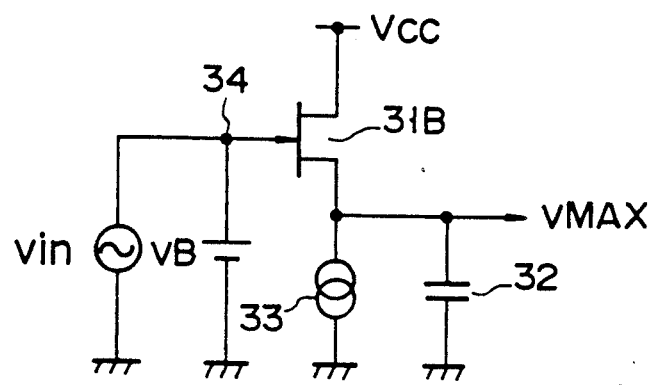
F I G. 11B
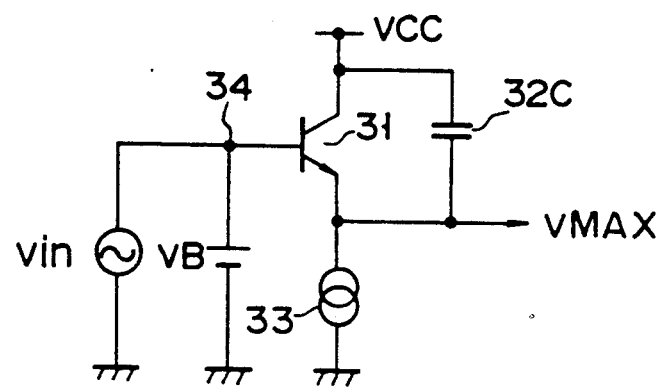
F I G. 11C

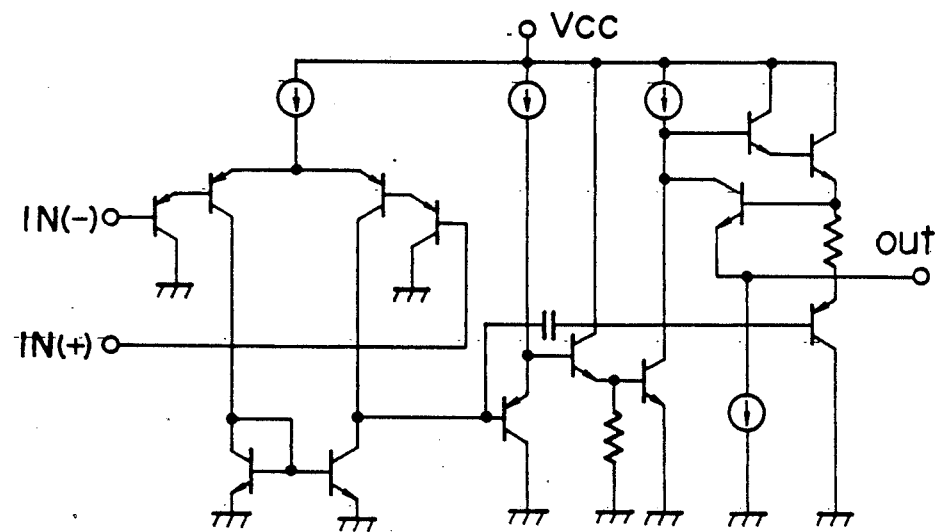
F I G. 13A
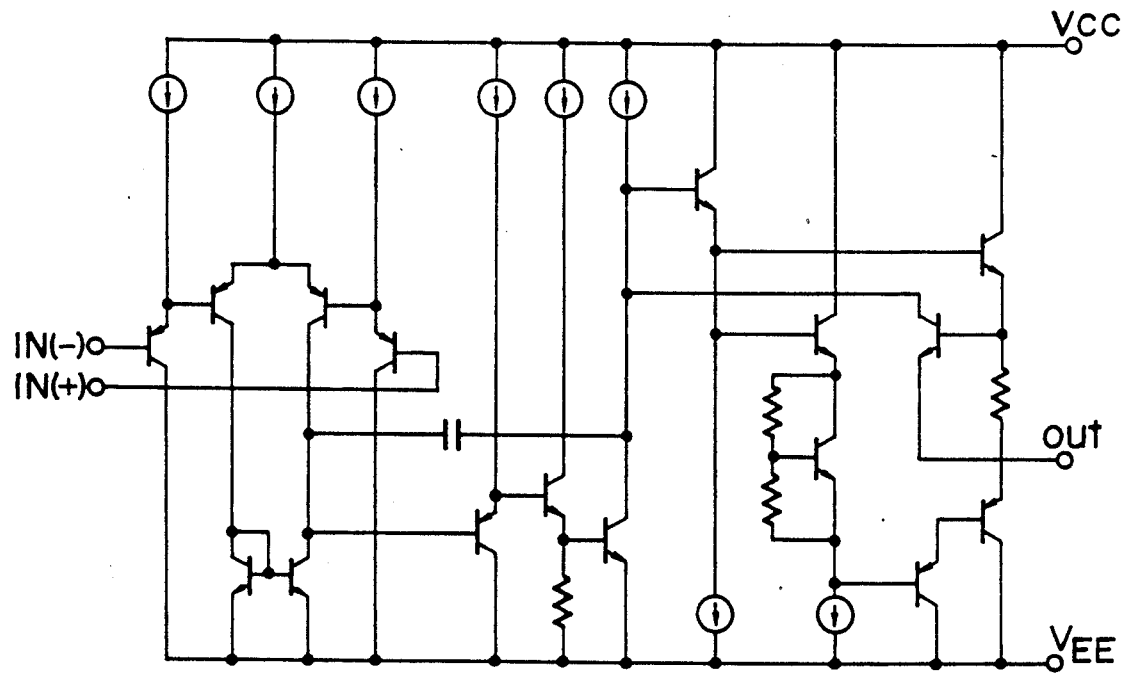
F I G. 13B

WAVE SHAPING CIRCUIT HAVING A MAXIMUM VOLTAGE DETECTOR AND A MINIMUM VOLTAGE DETECTOR

BACKGROUND OF THE INVENTION

1. Field of the Invention

The present invention relates to a Schmitt trigger circuit in which a malfunction due to variance in input signal voltage and internal voltage can be prevented.

2. Description of the Related Art

In general, a Schmitt trigger circuit is used as an interface between an analog circuit and a digital circuit. In other words, the Schmitt trigger circuit utilizes its inherent hysteresis characteristic, and converts an analog voltage waveform which varies gradually into a digital waveform which varies sharply, thus eliminating noise and parasitic oscillation components of the analog voltage. For performing this conversion, the Schmitt trigger circuit is designed so as to have a hysteresis characteristic between high and low threshold voltage levels. In designing the Schmitt trigger circuit, it is necessary that the high and low threshold voltages and a hysteresis voltage be set to desired values and these values have good repeatability.

FIG. 7 shows an example of a conventional Schmitt trigger circuit. In FIG. 7, DC voltage source 71 provides bias to input signal Vin. Operational amplifier 72 compares input signal Vin with high-level constant threshold voltage VA. Operational amplifier 73 compares input signal Vin with low-level constant threshold voltage VC. Voltage divider 74 comprises a plurality of resistors, which are series-connected between power source voltage Vcc and ground, and produces two-level threshold voltages VA and VC. Set/reset (RS) type flip-flop circuit 75 receives an output of operational amplifier 72 at set input S and receives an output of operational amplifier 73 at reset input R.

In the above-described circuit, if input signal Vin is supplied in accordance with the timing chart of FIG. 8. When the voltage of input signal Vin becomes higher than high-level side threshold voltage VA, operational amplifier 72 produces a "1" level signal. When the voltage of input signal Vin becomes lower than low-level side threshold voltage VC, the other operational amplifier 73 produces a "1" level signal. In other cases, the operational amplifiers produce "0" level signals. As a result, set signal S and reset signal R supplied to flip-flop circuit 75 vary, as shown in FIG. 8. By these set and reset signals, flip-flop circuit 75 is set and reset. Input signal Vin is thus converted to digital signal Sout through flip-flop circuit 75.

Now consider the case where a reproduced VTR control pulse signal is supplied, as input signal Vin, to the Schmitt trigger circuit. The level of the reproduced VTR control pulse signal changes according to variance in a record current for effecting recording on a magnetic tape, the speed of running of the tape, and characteristics of the tape. Mechanical noise, parasitic oscillation components or rippled components of power source voltages, and variant DC components in the electric circuit are superposed on the reproduced pulse signal. Considering these superposed components, two levels of threshold voltage VA and VC must be provided in the conventional art. However, in the event that the level of the reproduced control pulse signal and the level o the noise signal are both high while the levels of threshold voltages VA and VC are both low, as shown in FIG. 9, set signal S and reset signal R are erroneously produced from operational amplifiers 72 and 73 in periods in which pulses are, in fact, not supplied. As a result, converted digital signal Sout has an erroneous waveform. On the other hand, in the event that the level of the reproduced control pulse signal and the level of the noise signal are both low and do not reach the threshold levels, as shown in FIG. 10, set signal S and reset signal R are not produced, resulting in an erroneous waveform of digital output signal Sout.

In the circuit structure of FIG. 7, suitable two threshold voltage levels must be set in order to prevent an erroneous digital output from being produced. However, this setting of the suitable levels is very difficult, since various conditions must be considered.

As described above, it is difficult to set suitable threshold voltage levels in the Schmitt trigger circuit of FIG. 7. In this circuit, variance in the internal power source voltage may lead to malfunction.

SUMMARY OF THE INVENTION

The present invention has been made in consideration of the above circumstances, and its object is to provide a Schmitt trigger circuit, in which setting of threshold voltage levels is not required and variance in input signal voltage causes no malfunction.

A Schmitt trigger circuit of the present invention comprises maximum voltage detecting means for detecting and retaining a maximum voltage of an input signal, minimum voltage detecting means for detecting and retaining a minimum voltage of the input signal, threshold voltage generating means for receiving the maximum and minimum voltages of the input signal and generating a high level threshold voltage and a low level threshold voltage, first voltage comparing means for comparing the voltage of the input signal with the high level threshold voltage, second voltage comparing means for comparing the voltage of the input signal with the low level threshold voltage, and a flip-flop circuit controlled based on the outputs of the first and second voltage comparing means.

In the Schmitt trigger circuit of the present invention, the maximum and minimum voltages of the input signal are detected, and the high level and low level threshold voltages are set based on the maximum and minimum voltages. Also, both threshold voltages are suitably controlled in accordance with the change in voltage of the input signal.

BRIEF DESCRIPTION OF THE DRAWINGS

FIGS. 2 and 3 are timing charts for explaining the operation of the embodiment of FIG. 1;

FIGS. 4, 5 and 6 are circuit diagrams showing examples of maximum voltage detecting means, minimum voltage detecting means, and a flip-flop circuit of the embodiment of FIG. 1, respectively;

FIGS. 8, 9 and 10 are timing charts for explaining the operation of the circuit of FIG. 7;

FIGS. 11A, 11B and 11C show other examples of the maximum voltage detecting means;

FIGS. 13A and 13B show examples of an internal circuit of an operational amplifier;

DETAILED DESCRIPTION OF THE PREFERRED EMBODIMENTS

Embodiments of the present invention will now be described with reference to the accompanying drawings.

Figure 1:
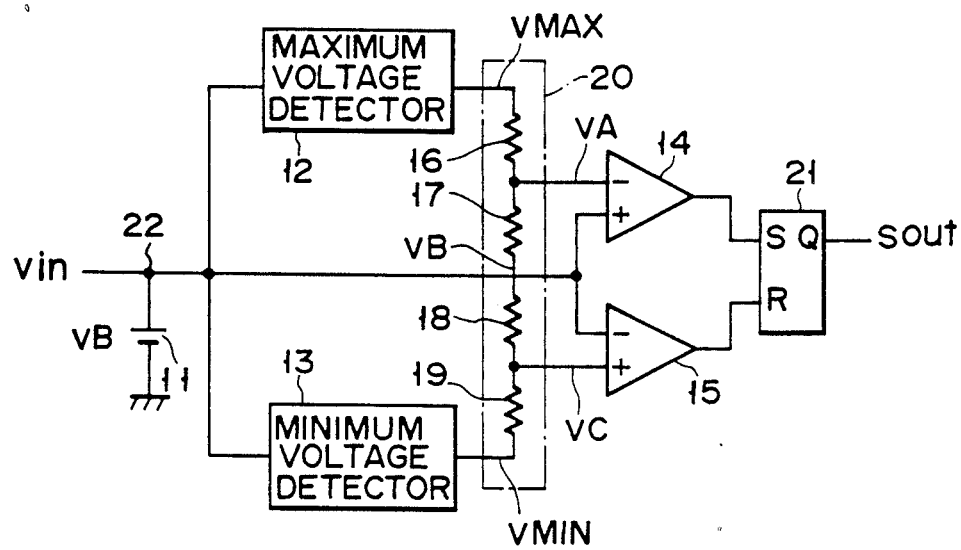
FIG. 1 is a circuit diagram showing an embodiment of the present invention.

FIG. 1 shows a Schmitt trigger circuit according to an embodiment of the present invention. In FIG. 1, reference power source VB is provided between an input node 22 of input signal Vin and a circuit ground. Input signal Vin is supplied to maximum voltage detecting means 12 for detecting and retaining a maximum voltage of input signal Vin and to minimum voltage detecting means 13 for detecting and retaining a minimum voltage of input signal Vin. The outputs of maximum voltage detecting means 12 and minimum voltage detecting means 13 are caused to flow through first resistor 16, second resistors 17 and 18 and third resistor 19 to produce threshold voltages. The produced threshold voltages are supplied to first and second voltage comparing means 14 and 15. The outputs of voltage comparing means 14 and 15 are supplied to flip-flop circuit 21 to produce final output signal Sout.

In other words, DC power source 11 provides a bias to input signal Vin which is a reproduced VTR control pulse signal. The biased input signal Vin is supplied to maximum voltage detector 12 and minimum voltage detector 13. The biased input signal in the output of detector 12 is also supplied to a non-inversion input node of first voltage comparing means or operational amplifier 14 and an inversion input node of second voltage comparing means or operational amplifier 15.

Maximum voltage detector 12 and minimum voltage detector 13 detect and retain maximum and minimum voltages of input signal Vin, respectively. Threshold voltage generator 20 comprising four resistors 16 to 19 are series-connected between the output node of detectors 12 and 13. More specifically, maximum voltage VMAX detected and retained by maximum voltage detector 12 is applied to one end of resistor 16 of threshold voltage generator 20, and minimum voltage VMIN detected and retained by minimum voltage detector 13 is applied to one end of resistor 19 of threshold voltage generator 20.

Threshold voltage generator 20 generates a high level threshold voltage VA from a node between resistors 16 and 17. Voltage VA is applied to the inversion input node of operational amplifier 14. On the other hand, threshold voltage generator 20 generates a low level threshold voltage VC from a node between resistors 18 and 19, and voltage VC is applied to the non-inversion input node of operational amplifier 15. The outputs of operational amplifiers 14 and 15 are supplied as set input S and reset input R to flip-flop circuit 21. A converted digital signal Sout is output from flip-flop circuit 21.

The resistance values of four resistors 16 to 19 of threshold voltage generator 20 may be equal to one another or may be different from one another.

The operation of the above circuit will now be described.

Figure 2:
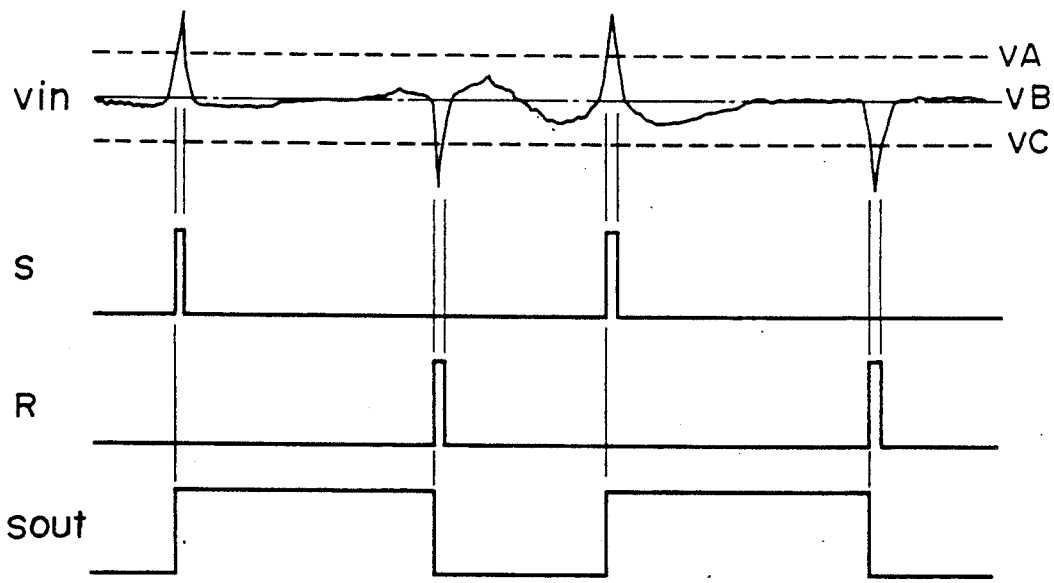

The timing chart of FIG. 2 shows the case where positive and negative peak values of pulses of input signal Vin are relatively large. In this case, maximum voltage VMAX detected and retained by maximum voltage detector 12 is high, and minimum voltage VMIN detected and retained by minimum voltage detector 13 is low. A hysteresis potential difference between high level threshold voltage VA and low level threshold voltage VC generated by threshold voltage generator 20 is relatively large. When the voltage of input signal Vin is higher than high level threshold voltage VA, operational amplifier 14 produces output S of "1" level, and, in other cases, operational amplifier 14 produces output S of "0" level. On the other hand, when the voltage of input signal Vin is lower than low level threshold voltage VC, operational amplifier 15 produces output R of "1" level, and, in other cases, operational amplifier 15 produces output R of "0" level. Input signal Vin is thus correctly converted to digital signal Sout.

The timing chart of FIG. 3 shows the case where the positive and negative peak values of pulses of input signal Vin are small. In this case, maximum voltage VMAX detected and retained by maximum voltage detector 12 is lower than that shown in FIG. 2, and minimum voltage VMIN detected and retained by minimum voltage detector 13 is higher than that shown in FIG. 2. The hysteresis potential value is thus lower than that of the case of FIG. 2. In general, when the positive and negative peak voltages of a reproduced control pulse signal are small, noise signal levels are low. In the case of FIG. 3, input signal Vin is also converted to a correct digital signal Sout.

According to the above circuit, the hysteresis potential value is changed according to the peak levels of input signal Vin. Thus, even if the input signal varies, there is no fear of malfunction of the circuit.

FIG. 4 shows a specific structure of maximum voltage detector 12 of the above embodiment. Input signal Vin is supplied to the base of npn bipolar transistor 31, by a node 34. Reference voltage source VB is provided between the base of transistor 31 and a circuit ground. Constant voltage source Vcc is connected to the collector of transistor 31, constant current source 33 is connected to the emitter of transistor 31. Capacitor 32 is connected between the emitter of transistor 32 and a circuit ground.

In this circuit, input signal Vin is supplied to the base of transistor 31, and capacitor 32 is charged by the output of transistor 31. Capacitor 32 is discharged with use of constant current source 33, so that capacitor 32 can retain maximum voltage VMAX of input signal Vin.

FIG. 5 shows a specific structure of minimum voltage detector 13 of the embodiment of FIG. 1. Input signal Vin is supplied to the base of pnp bipolar transistor 43 by a node 44. Reference voltage source VB is connected between the base of transistor 43 and a circuit ground. Constant current source 41 is connected to the emitter of transistor 43. Capacitor 42 is connected between the emitter of transistor 43 and a circuit ground.

In this circuit, capacitor 42 is charged with a constant current supplied from constant current source 41. Capacitor 42 is discharged through transistor 43, to the base of which input signal Vin is supplied. Capacitor 42 can thus retain minimum voltage VMIN of input signal Vin.

Figure 6:
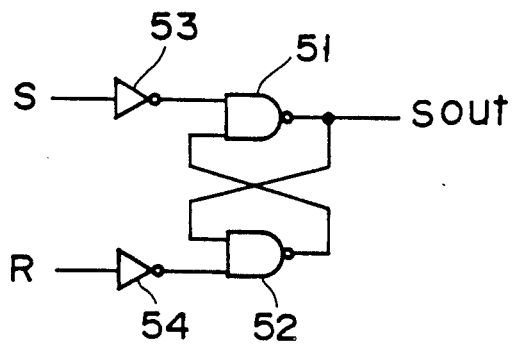
Figure 7:
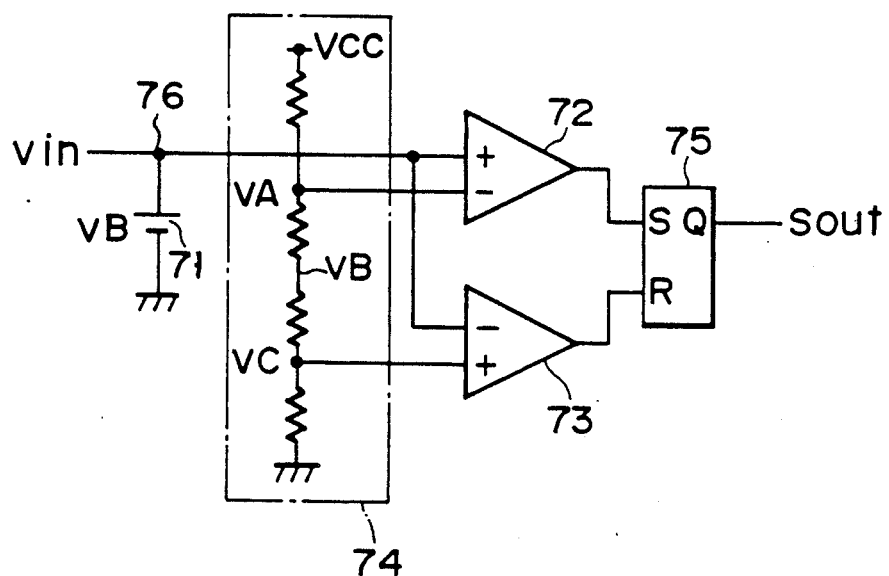
FIG. 7 is a circuit diagram of a conventional Schmitt trigger circuit.
Figure 9:
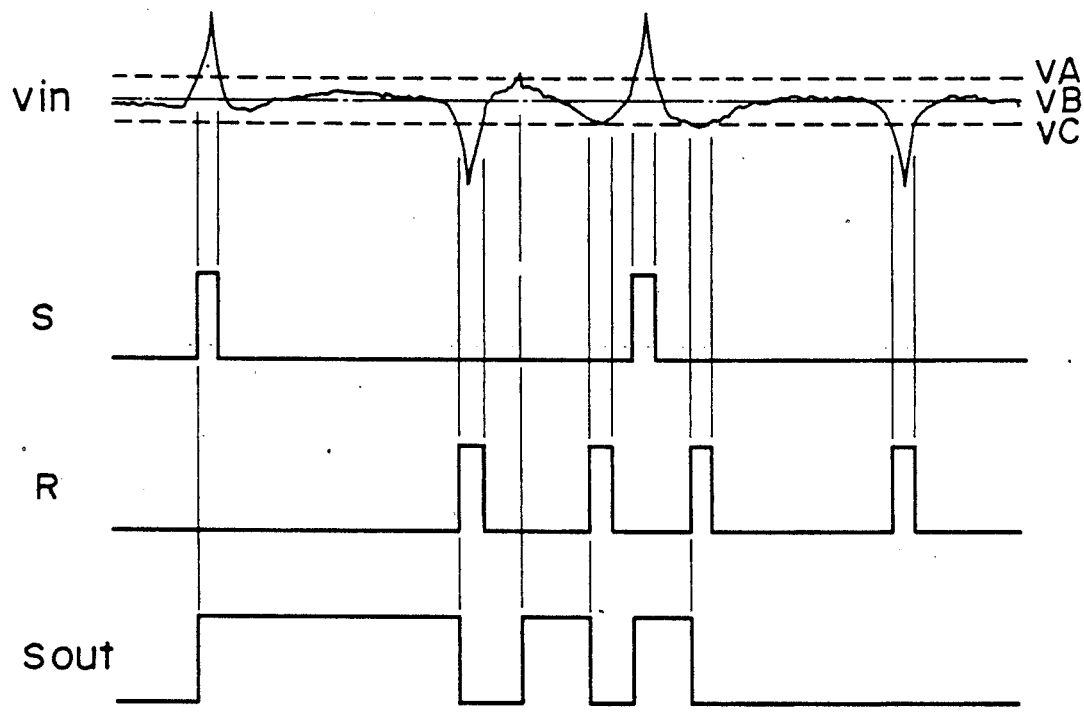
Figure 10:
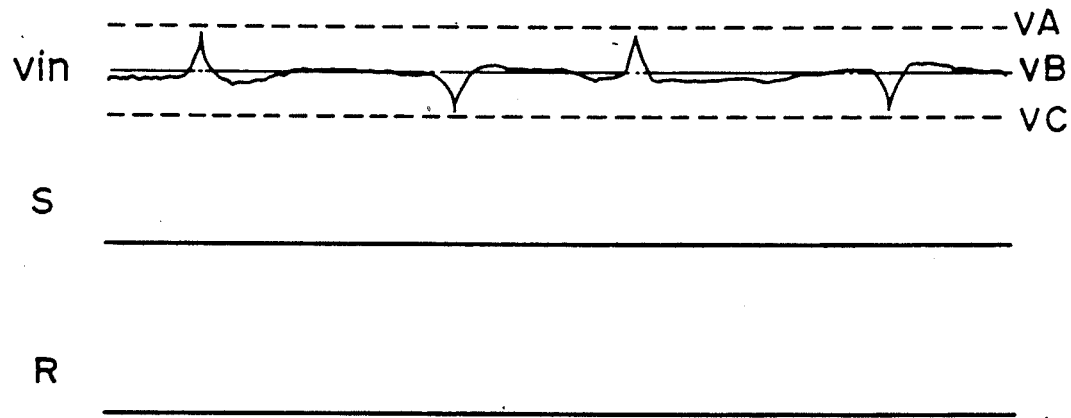

FIG. 6 shows a specific structure of RS flip-flop circuit 21 used in the embodiment of FIG. 1. Flip-flop circuit 21 comprises two-input NAND gates 51 and 52 having their input and output nodes connected in a crossing manner, and inverters 53 and 54 for inverting outputs S and R of operational amplifiers 14 and 15 and supplying the inverted outputs S and R to NAND gates 51 and 52.

The present invention is not limited to the above embodiment, and various modifications may be made to the invention. For example, regarding four resistors 16 to 19 connected in series in threshold voltage generator 20, resistors 17 and 18 may be replaced with a single resistor. Also, maximum voltage detector 12 and minimum voltage detector 13 may be constructed, for example, by digital circuits.

Figure 12A:
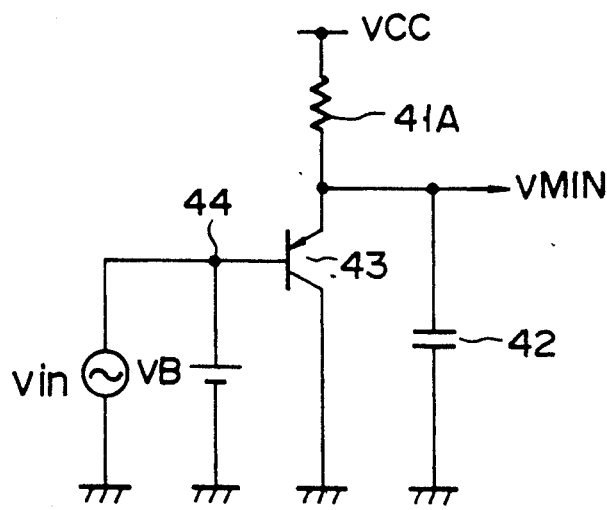
FIGS. 12A, 12B and 12C show other examples of the minimum voltage detecting means.
Figure 12B:
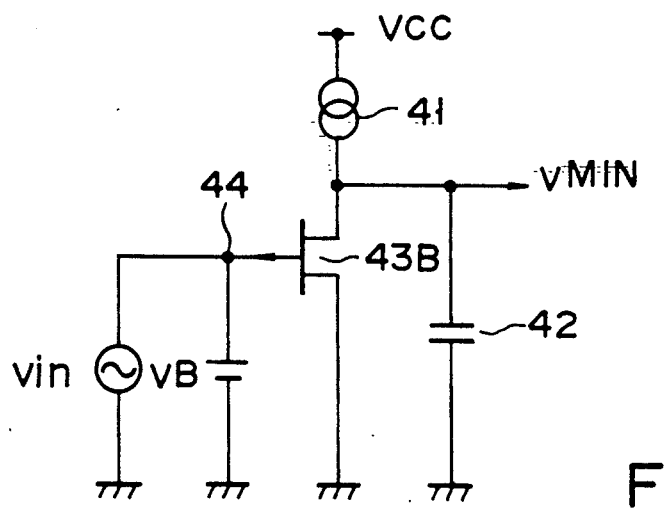
Figure 12C:
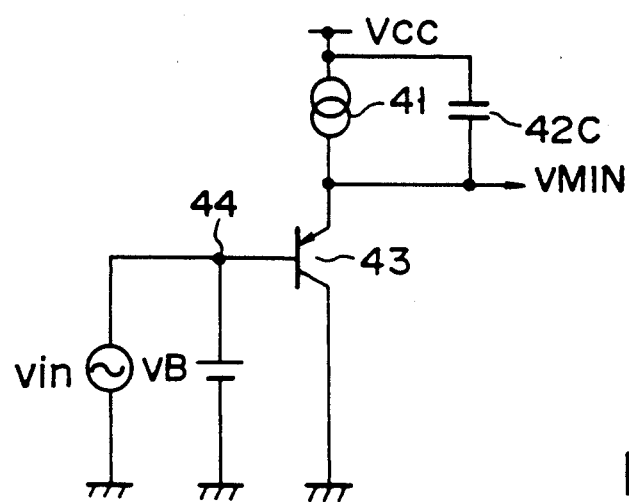

FIGS. 11A to 11C show other embodiments of maximum voltage detector 12, and FIGS. 12A to 12C show other embodiments of minimum voltage detector 13. In FIGS. 11A to 12A, current sources 33 and 41 are replaced with resistors 33A and 41A. In FIGS. 11B and 12B, bipolar transistors 31 and 43 are replaced with field-effect transistors 31B and 43B. In FIGS. 11C and 12C, capacitors 32 and 42 connected between the outputs of transistors 31 and 43 and a circuit ground are replaced with capacitors 32C and 42C connected between the outputs of transistors 31 and 43 and power sources Vcc.

FIGS. 13A and 13B show typical examples of operational amplifiers 14 and 15.

Figure 13C:
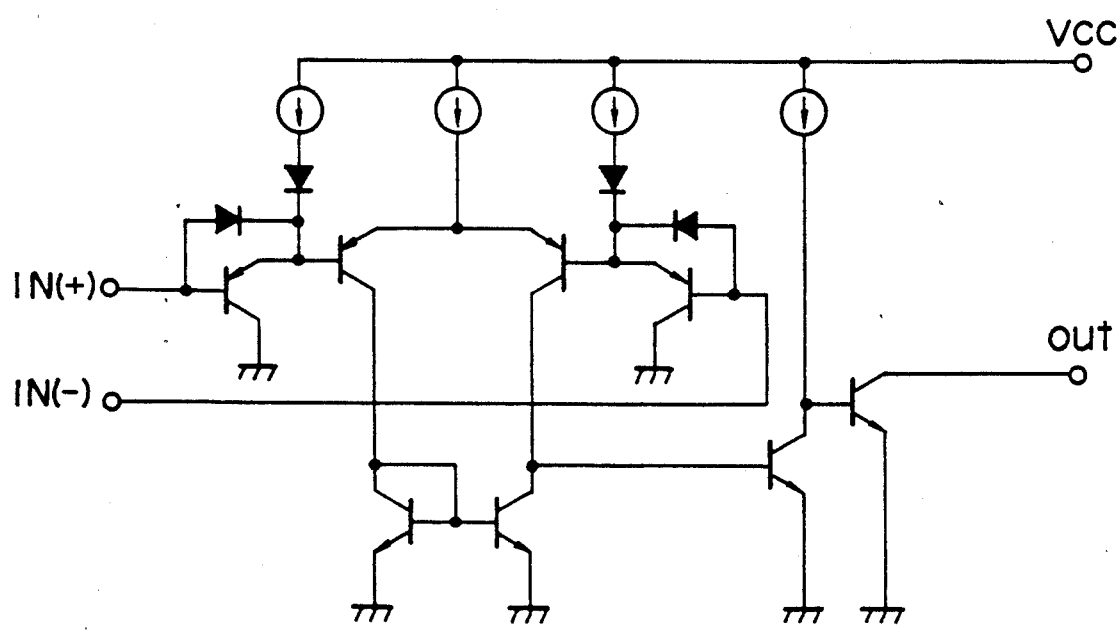
FIG. 13C shows an example of a circuit of a comparator.

FIG. 13C shows typical example of circuit of comparator.

Figure 14:
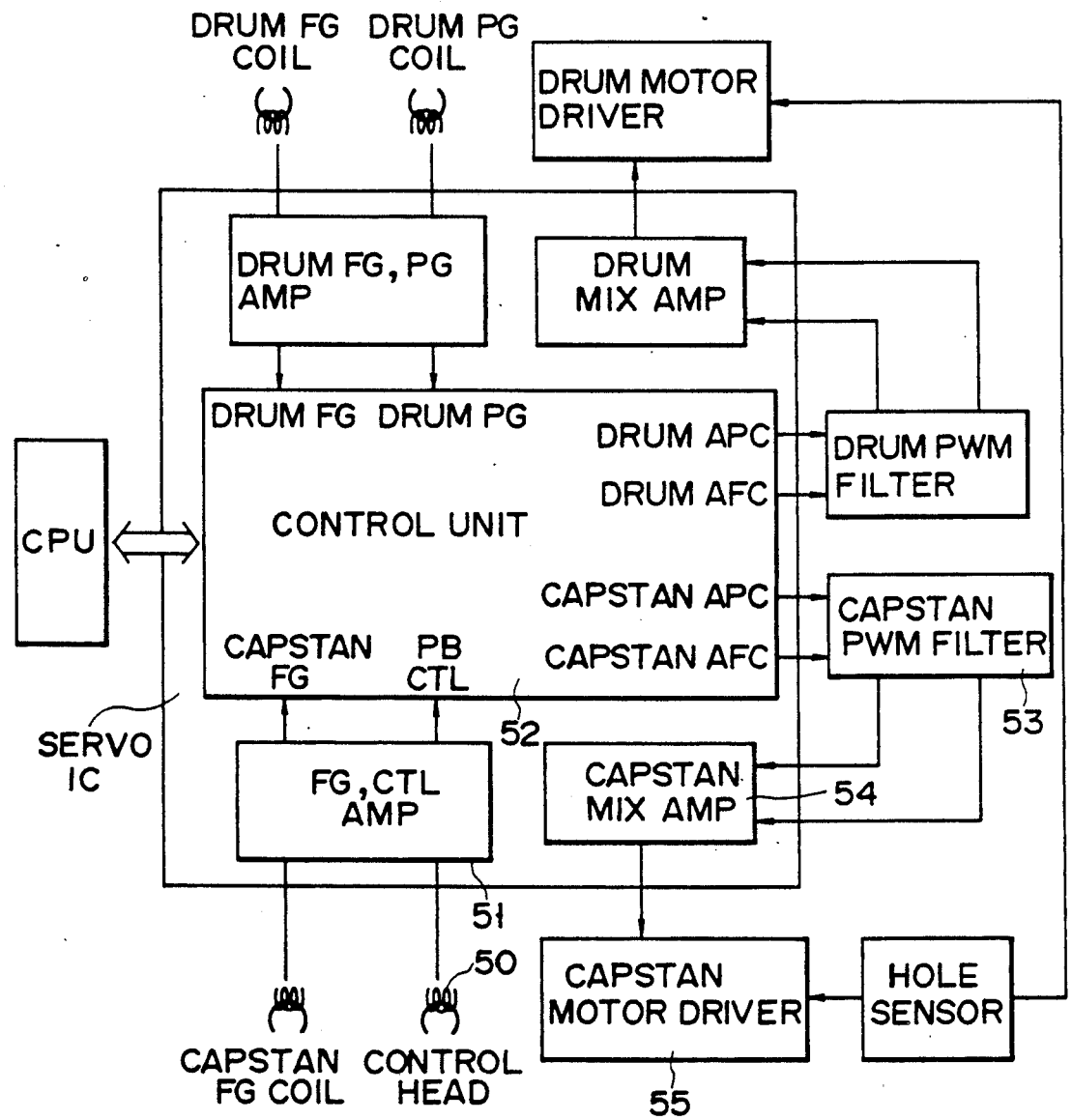
FIG. 14 is a block diagram showing a servo system applied to the present invention.

FIG. 14 shows a system program in the case where the present invention is applied to a servo system of a video deck. This system comprises a drum system for controlling the rotation speed of a rotational video head for recording and detecting video signals, and a capstan system for controlling the speed of running a tape.

The drum system is controlled such that signals from a drum FG (frequency generator) coil and a drum PG (phase generator) coil are supplied to a servo control section and, after a control amount is calculated, a drum motor driver is controlled.

On the other hand, the capstan system is controlled such that signals from a capstan FG (frequency generator) coil and a control head are supplied to servo control section 52 and, after a control amount is calculated, capstan motor driver 55 is controlled. Control pulses recorded on the tape are detected by control head 50 and amplified by control amplifier 51. Then, the control pulses are supplied to the Schmitt trigger circuit of the present invention employed in servo control section 52, and are converted to digital signals. The converted digital pulses (control pulses) are compared with reference signals produced by an oscillator within the servo IC. A phase difference between these signals is output from capstan APC as a PWM signal. The output PWM signal is converted into a DC voltage and supplied to capstan motor driver 55, thus controlling the tape running speed.

In this system, high precision is required in an interface region of servo control section 52. The Schmitt trigger circuit of the present invention can realize a control system in which an error due to variance in internal voltage or input signal voltage is made small.

The present invention can effectively be applied to other system which requires precise operation and uses a Schmitt trigger circuit for converting an analog signal to a digital signal.

I claim:

1. A Schmitt trigger circuit comprising:
    maximum voltage detecting means for detecting and retaining a maximum voltage of an input signal;
    minimum voltage detecting means for detecting and retaining a minimum voltage of said input signal;
    threshold voltage generating means for receiving said detected maximum and minimum voltages and generating a high-level threshold voltage and a low-level threshold voltage;
    first voltage comparing means for comparing a voltage of said input signal with said high-level threshold voltage;
    second voltage comparing means for comparing a voltage of said input signal with said low-level threshold voltage; and
    a flip-flop circuit controlled by outputs from said first and second voltage comparing means to produce a predetermined output signal.

2. The Schmitt trigger circuit according to claim 1, wherein said threshold voltage generating means includes resistor means.

3. The Schmitt trigger circuit according to claim 1, wherein said maximum voltage detecting means comprises:
    a reference voltage source connected to an input node receiving said input signal;
    a power source;
    a bipolar transistor having a base connected to said input node receiving said input signal and to said reference voltage source, and a collector connected to said power source;
    a constant current source connected between an emitter of said bipolar transistor and a circuit ground; and
    a capacitor connected between the emitter of the bipolar transistor and a circuit ground.

4. The Schmitt trigger circuit according to claim 1, wherein said maximum voltage detecting means comprises:
    a reference voltage source connected to an input node receiving said input signal;
    a power source;
    a bipolar transistor having a base connected to said input node receiving said input signal and to said reference voltage source, and a collector connected to said power source;
    a resistor connected between an emitter of said bipolar transistor and a circuit ground; and
    a capacitor connected between the emitter of the bipolar transistor and a circuit ground.

5. The Schmitt trigger circuit according to claim 1, wherein said maximum voltage detecting means comprises:
    a reference voltage source connected to an input node receiving said input signal;
    a power source;
    a field-effect transistor having a gate connected to said input node receiving said input signal and to said reference voltage source, and a drain connected to said power source;
    a constant current source connected between a source of said FET and a circuit ground; and
    a capacitor connected between the source of said FET and a circuit ground.

6. The Schmitt trigger circuit according to claim 1, wherein said maximum voltage detecting means comprises:
   a reference voltage source connected to an input node receiving said input signal;
   a power source;
   a bipolar transistor having a base connected to said input node receiving said input signal and to said reference voltage source, and a collector connected to said power source;
   a constant current source connected between an emitter of said bipolar transistor and a circuit ground; and
   a capacitor connected between the emitter of the bipolar transistor and said power source.

7. The Schmitt trigger circuit according to claim 1, wherein said minimum voltage detecting means comprises:
   a reference voltage source connected to an input node receiving said input signal;
   a power source;
   a constant current source connected to said power source;
   a bipolar transistor having a base connected to said input node receiving said input signal and to said reference voltage source, and an emitter connected to said constant current source, and a collector connected to a circuit ground; and
   a capacitor connected between the emitter of said bipolar transistor and a circuit ground.

8. The Schmitt trigger circuit according to claim 1, wherein said minimum voltage detecting means comprises:
   a reference voltage source connected to an input node receiving said input signal;
   a power source;
   a resistor connected to said power source;
   a bipolar transistor having a base connected to said input node receiving said input signal and to said reference voltage source, and an emitter connected to said resistor, and a collector connected to a circuit ground; and
   a capacitor connected between the emitter of said bipolar transistor and a circuit ground.

9. The Schmitt trigger circuit according to claim 1, wherein said minimum voltage detecting means comprises:
   a reference voltage source connected to an input node receiving said input signal;
   a power source;
   a constant current source connected to said power source;
   a field-effect transistor having a gate connected to said input node receiving said input signal and to said reference voltage source, and a source connected to said constant current source, and a drain connected to a circuit ground; and
   a capacitor connected between the source of said FET and a circuit ground.

10. The Schmitt trigger circuit according to claim 1, wherein said minimum voltage detecting means comprises:
    a reference voltage source connected to an input node receiving said input signal;
    a power source;
    a constant current source connected to said power source;
    a bipolar transistor having a base connected to said input node receiving said input signal and to said reference voltage source, and an emitter connected to said constant current source, and a collector connected to a circuit ground; and
    a capacitor connected between the emitter of said bipolar transistor and said power source.

11. A Schmitt trigger circuit comprising:
    an input node receiving an input signal;
    a reference voltage source connected between said input node receiving said input signal and a circuit ground;
    maximum voltage detecting means for detecting and retaining a maximum voltage of said input signal;
    minimum voltage detecting means for detecting and retaining a minimum voltage of said input signal;
    a first resistor connected at one end to said maximum voltage detecting means
    a second resistor connected at one end to an other end of said first resistor;
    a third resistor connected at one end to an other end of said second resistor and at an other end to said minimum voltage detecting means;
    first voltage comparing means having a first input node, a second input node and an output node, said first input node being connected to a node between said first resistor and said second resistor, and said second input node being connected to said input node of said input signal;
    second voltage comparing means having a first input node, a second input node and an output node, said first input node being connected to said input node of said input signal, and said second input node being connected to a node between said second resistor and said third resistor; and
    a flip-flop circuit connected to said output nodes of the first and second voltage comparing means to produce a predetermined output signal.

12. The Schmitt trigger circuit according to claim 11, wherein said maximum voltage detecting means comprises:
    a reference voltage source connected to an input node receiving said input signal;
    a power source;
    a bipolar transistor having a base connected to said input node receiving said input signal and to said reference voltage source, and a collector connected to said power source;
    a constant current source connected between an emitter of said bipolar transistor and a circuit ground; and
    a capacitor connected between the emitter of the bipolar transistor and a circuit ground.

13. The Schmitt trigger circuit according to claim 11, wherein said minimum voltage detecting means comprises:
    a reference voltage source connected to an input node receiving said input signal;
    a power source;
    a constant current source connected to said power source;
    a bipolar transistor having a base connected to said input node receiving said input signal and to said reference voltage source, and an emitter connected to said constant current source, and a collector connected to a circuit ground; and
    a capacitor connected between the emitter of the bipolar transistor and a circuit ground.

* * * * *